United States Patent [19]
Burnham et al.

[11] 3,984,262
[45] Oct. 5, 1976

[54] METHOD OF MAKING A SUBSTRATE STRIPED PLANAR LASER

[75] Inventors: Robert B. Burnham, Los Altos Hills; Donald R. Scifres, Los Altos, both of Calif.

[73] Assignee: Xerox Corporation, Stamford, Conn.

[22] Filed: Dec. 9, 1974

[21] Appl. No.: 530,898

[52] U.S. Cl. ............................. 148/172; 148/1.5; 148/171; 148/187; 148/191; 357/16; 357/18; 331/94.5 H
[51] Int. Cl.² ......................................... H01L 7/38
[58] Field of Search ............ 148/1.5, 171, 191, 172, 148/187; 357/18, 16; 331/94.5 H

[56] References Cited
UNITED STATES PATENTS

| | | |
|---|---|---|
| 3,495,140 | 2/1970 | Cornely et al. ................. 357/16 X |
| 3,838,359 | 9/1974 | Hakki et al. ................... 331/94.5 H |
| 3,849,790 | 11/1974 | Gottsmann et al. ................. 357/18 |

OTHER PUBLICATIONS
Dumke et al., *IBM Technical Disclosure Bulletin*, vol. 16, No. 6, Nov. 1973, p. 1758.
Dumke, *IBM Technical Disclosure Bulletin*, vol. 16, No. 4, Sept. 1973, p. 1186.

*Primary Examiner*—G. Ozaki
*Attorney, Agent, or Firm*—J. E. Beck; T. J. Anderson; A. W. Karambelas

[57] ABSTRACT

A method of making a diode laser in which a pump current confining channel is formed on the n-side of the diode laser prior to the growth of the active region of the diode laser. The current confining channel is formed by providing two spaced regions in a substrate with the regions being highly resistive to current flow when the diode laser is forwarded biased. Preferably, the regions are formed by diffusion of an impurity into a substrate of a selected conductivity type so as to form secondary p-n junctions on both sides of an intermediate channel, with subsequent growth of other layers of the diode laser providing a primary p-n junction at the boundary of the active laser region. Forward biasing of the primary p-n junction results in reverse biasing of the secondary p-n junctions and pump current confinement to the channel.

8 Claims, 10 Drawing Figures

METHOD OF MAKING A SUBSTRATE STRIPED PLANAR LASER

This application relates to U.S. application Ser. No. 530,900, titled "Substrate Striped Planar Laser", filed Dec. 9, 1974.

BACKGROUND OF THE INVENTION

For many practical applications of diode lasers it is desirable to operate the laser in a continuous wave (CW) mode, i.e., at room temperature with a d.c. bias voltage of between about 3 to 6 volts. To achieve CW operation the current density in the active region of the diode laser must reach about 2000 amps/cm$^2$. Such high current density is difficult to achieve when the active (pumped) area of the laser is large resulting in high total current flow and subsequent overheating.

One of the aforementioned practical applications of diode lasers is utilization as a light source in an integrated optical system using fiber optic elements which may be on the order of only 10 microns in diameter. When the active gain region of the laser is large, several filamentary areas lase over the entire active region. Since the active region is larger than the diameter of the fiber optic elements, the fiber optic elements will transmit light from less than all of the filamentary areas. Thus, power is expended to pump filamentary areas which do not contribute to light output. Also, pumping of used and unused filamentary areas necessitates high pumping current which causes heat dissipation problems.

Several attempts have previously been made to decrease the active region of diode lasers by providing pumping current confinement. These attempts have been focused on modification of the diode laser structure after completion of the growth of that structure. Specifically, it has been attempted to provide a low resistance current channel through the p-side of a diode laser, with the channel extending to within close proximity to the active region and with a high resistance path on both sides of the channel. The low resistance channel, which can be dilineated by ion implantation, diffusion and etching techniques, is formed in the p-side of the diode laser, and, as noted, after complete growth of the diode laser.

Several problems exist with providing current confinement from the p-side of the diode laser after complete growth of the laser. First, the low resistance channel must be formed through at least two semiconductor regions which can have variable thickness due to process imperfections, thereby making it difficult to bring the channel into close, uniform proximity to the active region without extending into the active region. Also, the width of the channel is hard to control. Thus, threshold current reduction by operating on the p-side of the diode laser after complete growth of the diode laser fails to provide reliability in device operation. Also, to provide the low resistance channel an additional continuous layer must be formed on the p-side of the diode. This additional layer moves the metallized contact on the p-side of the diode further from the active region which makes the channel long with the possibility of increased resistance. Also, with the metallized contact further removed from the active region, heat dissipation can be a problem.

OBJECTS OF THE INVENTION

An object of the present invention is to provide an improved method of making a diode laser.

Another object of the present invention is to provide a method of making a diode laser having improved pump current confinement.

A further object of the present invention is to provide a method of making a diode laser that requires less pumping current.

A still further object of the present invention is to provide an improved method of making a heterojunction diode laser.

A still further object of the present invention is to provide a method of making a diode laser capable of CW mode operation.

SUMMARY OF THE INVENTION

In accordance with the invention, the aforementioned objects are achieved by a diode laser in which current confinement is achieved by a low resistance channel on the n-side of the diode laser. The channel is formed in the device substrate before the growth of the layers that define the active region of the laser thereby avoiding damage to these layers with the resulting increasing in device reliability. Since the channel is formed on the substrate, its width can be closely controlled and a plurality of channels can be formed simultaneously (with many devices formed from one substrate by subsequent dicing). Current confinement can be further reduced, with the attendant advances of lower pumping current, greater heat dissipation, and single filament operation, by forming current confining channels on both sides of the active region.

Preferably, the current confining channel on the n-side of the diode laser is provided by a diffusion process through a polished surface of a substrate which has stripes of photoresist material thereupon. The diffused areas form p-n junctions with the substrate material with the channel bounded on both sides by these p-n junctions. Following the diffusion, the remaining layers of the laser diode are grown. Current confinement is achieved because the channel in the substrate allows current to flow while the diffused areas do not conduct due to a reverse bias on the p-n junctions associated with the diffused areas.

DESCRIPTION OF THE PREFERRED EMBODIMENT

The invention will be discussed in relation to a double heterojunction diode laser. It is apparent, however, that the improved current confining structure is equally applicable to single heterojunction diode lasers and homostructure diode lasers.

Figure 1:
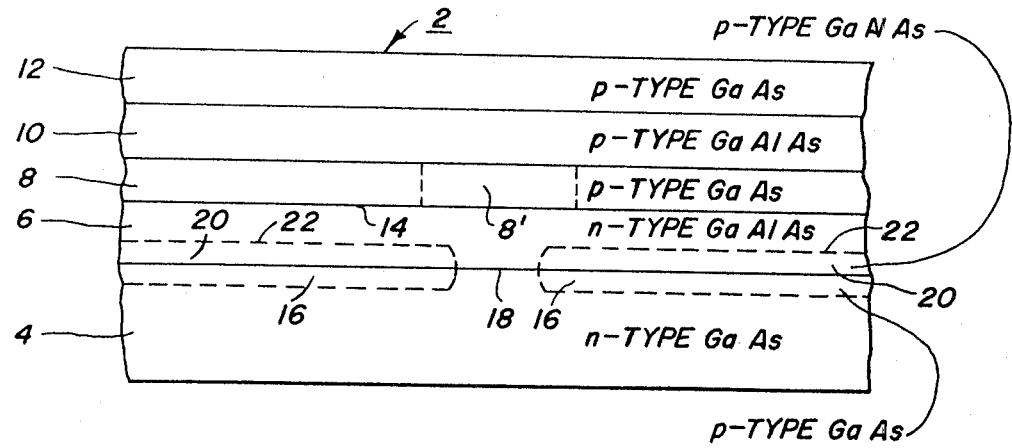
FIG. 1 is a side elevation view of a diode laser produced by the method of the invention.

Referring now to FIG. 1, there is shown double heterojunction diode 2. Diode 2 includes an n-type GaAs substrate 4, an n-type GaAlAs layer 6, a p-type GaAs layer 8, a p-type GaAlAs layer 10 and a p-type GaAs layer 12. Layer 12 is provided for ease in fabricating an electrical contact (not shown) on the p-side of the laser.

Due to its base material (GaAs) and doping concentration, the layer 8 has a band gap of approximately 1.4 eV, which is substantially lower than the approximately 1.8 eV band gap of layers 6 and 10. Also, the refractive index of layer 8 is substantially greater (approximately 3.6) than the approximately 3.4 refractive index of layers 6 and 10. As is well known, when a forward bias (a positive voltage to layer 12 and a relatively negative voltage to substrate 4) is applied to the p–n junction 14 electrons are injected from layer 6 into layer 8 and are confined to layer 8 by the potential difference produced by the heterojunction layer 10. With sufficient pump current, population inversion is achieved and gain is obtained with light produced by radiative recombination of the carriers in region 8. This light is guided in layer 8 due to its higher refractive index relative to that of regions 6 and 10.

Current confinement is achieved by p-type GaAs regions 16 which define a channel 18 therebetween. P-type GaAlAs regions 20 are formed during the growth of layers 6, 8, 10 and 12 by back diffusion of the p-type impurity of regions 16 into layer 6. Current confinement is achieved by channel 18 (which preferably is on the order of 10 microns wide) because the p–n junctions 22 between layer 6 and regions 20 are reverse biased (when the diode is forward biased as previously explained), and pumping current is thus confined to the n-type channel 18 in substrate 4 and layer 6. The laser diode of FIG. 1 provides improvement over devices in which current confinement is confined to the p-type layers of the diode because regions 16 are formed before the layers 6, 8, 10 and 12 are formed, with regions 20 being formed inherently with formation of layers 6, 8, 10 and 12.

Figure 2:
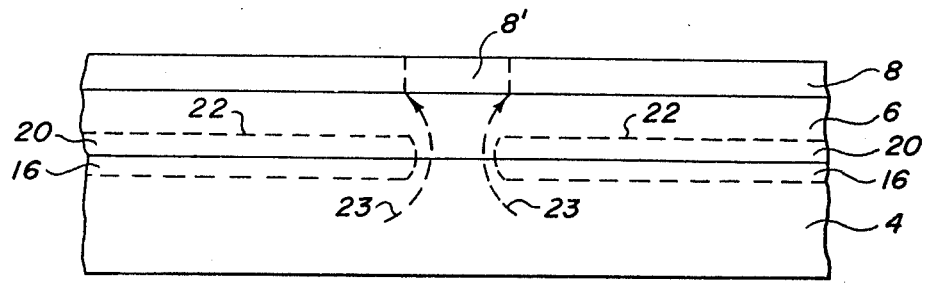
FIG. 2 shows the path of pumping current in a portion of the laser of FIG. 1.

The pumping current confinement of the laser of FIG. 1 is explained in conjunction with FIG. 2 which shows only a portion of the laser of FIG. 1. The segmented arrows 23 in FIG. 2 show the path of pumping current from substrate 4 to layer 8. As noted, current flow is restricted to passage through channel 18 because the p–n junctions 22 are reverse biased when the diode laser is forward biased. Thus, the path of the pumping current is confined and only a small portion of the layer 8 (the active region 8') is pumped. Since the pumped active region is relatively small (believed to be about 20–30 microns wide when channel 18 is about 10 microns wide) compared to the width of the region 8 which conventionally is about 250 microns wide, less pumping current is required to provide the current density (amp/cm$^3$) sufficient to initiate lasing than is needed to provide a similar current density in conventional diode lasers. Accordingly, less heat is produced by the pumping and the diode laser of FIG. 1 can be readily heat sunk to provide CW room temperature operation.

With the active region relatively narrow, fewer (and preferably only one) filamentary areas will lase, providing more efficient operation when the laser is used as a light source in conjunction with thin fiber optic elements. Also, the thinness of the active region substantially restricts laser operation to the lowest order transverse mode since higher order modes do not have sufficient intensity in the active region to provide sufficient coupling for lasing.

As shown by FIG. 2, the segmented arrows 23 (representing current flow) do not spread substantially in layer 6. This confinement is due to the low doping (about 10$^{17}$/cm$^3$) of region 6. Also, region 6 is made thin, about 0.2 micron, to reduce current spreading. There is not much spreading in region 8' since this region is only about 0.3 microns thick.

As shown by FIG. 1, the device 2 includes only layers 10 and 12 above the active region 8' and not additional layer as is used when current confinement is from the p-side of the diode laser. With only layer 10 and 12 on the p-side, which layers 10 and 12 can have a thickness of about 2 microns and about 2 microns, respectively, the active region 8' can be located close to a heat sink to thereby provide efficient heat dissipation.

Figure 3A:
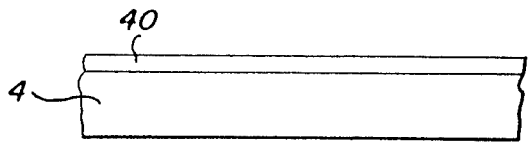
FIG. 3 (a–g) shows steps in the method of making the diode laser of FIG. 1.
Figure 3B:
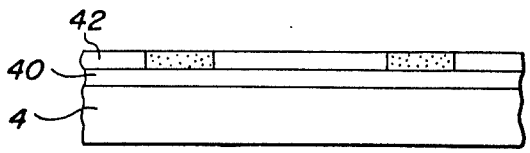
Figure 3C:
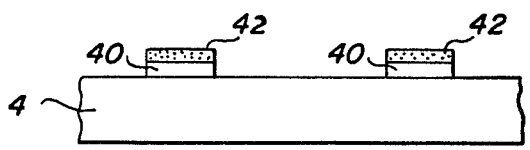
Figure 3D:
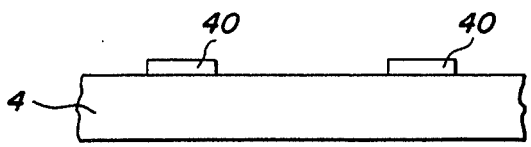
Figure 3E:
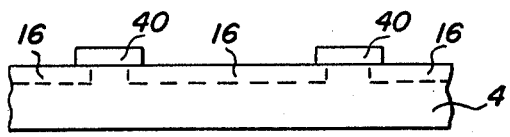

The laser of FIG. 1 is made by a process which provides for formation of channel 18 prior to formation of layers 6, 8, 10 and 12. As shown in FIG. 3a, fabrication is initiated by depositing a thin layer 40 of silicon nitride ($Si_3N_4$) on a smooth, polished surface of an n-type GaAs substrate 4 which can have a doping level of 2 – 4 × 10$^{18}$/cm$^3$, with the dopant being silicon or tellurium. The silicon nitride layer can be deposited by conventional vapor deposition technique to a thickness of about 1500 A. Next, a conventional ultraviolet sensitive photoresist 42, such as Shipley AZ 1350, is deposited over layer 40, followed by exposure of the resist as shown in FIG. 3b where the dotted portions of layer 42 have been exposed to ultraviolet light to make these portions insensitive to a reagent such as acetone. The unexposed portions of layer 42 are then removed such as by immersion of the device of FIG. 3b in a bath of a reagent such as acetone. The exposed portions of layer 40 not protected by resist are then removed, as by a plasma etch composed of fluorine gas and a small amount of oxygen to provide the structure of FIG. 3c. Following removal of the remainder of the resist, as shown in FIG. 3d, the device of FIG. 3d is placed in a diffusion ampoule and a p-type dopant, such as zinc, is diffused into the top of substrate 4 to form p-type regions 16, as shown in FIG. 3e, with the $Si_3N_4$ being resistive to the diffusion of Zn therethrough and thus acting as a mask. Regions 16 preferably have a doping level of 5 – 10 × 10$^{18}$cm$^{-3}$.

Figure 3F:
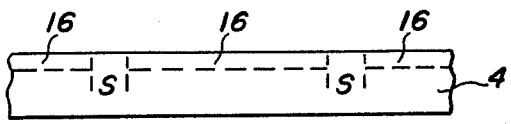

The width of the $Si_3N_4$ areas 40 of FIG. 3d is chosen such as to achieve a desired spacing S between adjacent p-type regions 16. Since there is lateral diffusion, as well as depth diffusion of the p-type dopant, a desired spacing S of about 10 microns is achieved by having areas 40 about 18 microns wide, with the diffusion depth being about 4 microns. The separation between areas 40 can be 500 microns. Following formation of regions 16, the areas 40 are removed by a suitable, conventional solvent, such as by a plasma etch, to thereby provide the structure of FIg. 3f.

Figure 3G:
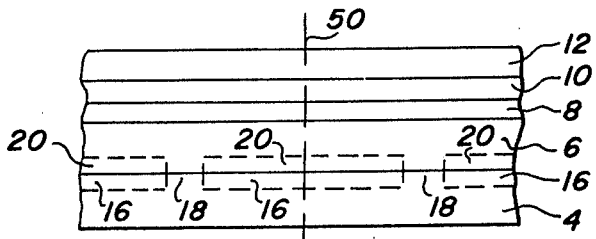

Layers 6, 8, 10 and 12 are now grown (as shown in FIG. 3g) in a conventional manner by means of liquid phase epitaxial growth. During these growth processes there is some back-diffusion of zinc into layer 6 resulting in the formation of regions 20 and p–n junctions 22 which, when the laser diode is forward biased, prevents current flow through regions 16 and 20 and restricts current flow to channel 18. The process described provides a plurality of diode lasers with pump current confinement, with individual diode lasers being formed by cutting the device of FIG. 3g along the segmented line 50.

Figure 4:
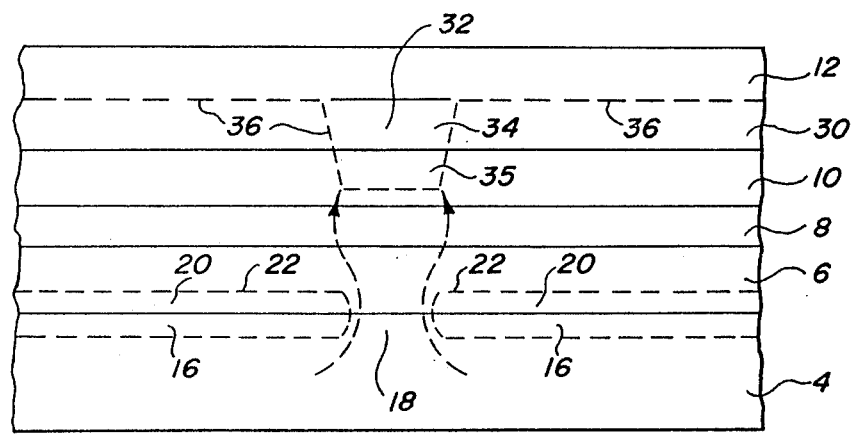
FIG. 4 shows a further embodiment of a diode laser produced by the method of the invention.

A further improvement in current confinement is achieved by confining current on both sides of the active region. FIG. 4 shows such a structure which differs from the device of FIg. 1 by the addition of n-type GaAs layer 30 and the channel 32 formed by regions 34 and 35 which are p-type regions. Regions 34 and 35 can be formed by conventional diffusion processes. The segmented arrows in FIG. 4 depict the flow of pumping current through the device. Since the p–n junctions 36 formed between layer 30 and layer 12 and layer 30 and region 34, as well as p–n junctions 22, are reverse biased when the diode is forward biased, the pumping current must flow through channels 18 and 32 as shown, which provides even greater current confinement and a smaller active region than the device of FIG. 1. Also, since the current flow cannot spread substantially in layers 6, 8 and 10 because it can only later pass through channel 32, the width of channel 18 can be further reduced to between 5 and 10 microns.

The channel 18 can be formed by other than diffusion techniques. For example, substrate 4 can be formed with regions 16 as intrinsic regions, or proton implantation could be used to create insulating regions in place of diffused regions 16. In these cases, regions 22 would not be formed but current would still be confined to channel 18 by the insulating regions. Channel 32 could also be formed by other than diffusion techniques similar to those used to form channel 18. Also, stripes could be formed in p-type substrates which might be especially usefor for lasers made from other material other than the GaAs-AlAs system.

The doping level of layers 8, 10 and 12 can vary by quite a large range with levels of $5 \times 10^{16} - 10^{18}/cm^3$, $5 \times 10^{17} - 10^{19} cm^3$, respectively, being preferred. Doping of all the layers can vary by wide ranges depending upon the way in which the laser material is used. For example, if the laser is to be used for coupling light out normal to the plane of the p–n junction than either layer 18 or layer 12 might be more lightly doped in order to reduce absorption losses.

We claim:
1. A method of making a diode laser having a p–n junction for the injection of minority carriers comprising the steps of:
    forming in a surface of a substrate of semiconductor material of a first conductivity type adjacent surface regions of material that define a channel therebetween said channel being defined by adjacent regions of intrinsic semiconductor material,
       growing upon said substrate surface having said adjacent surface regions a first layer of semiconductor material of said first conductivity type,
       growing upon said first layer of semiconductor material a second layer of semiconductor material of the other conductivity type to thereby provide said p–n junction between said first and second layers, and
    providing means for forward biasing said p–n junction such that pumping current flows through said channel to provide the injection of minority carriers across said p–n junction to thereby provide coherent light.
2. The method as defined in claim 1 wherein said channel is defined by adjacent insulating regions formed by implantation of protons into said surface of said substrate.
3. A method of making a heterojunction diode laser having a p–n junction for the injection of minority carriers, comprising the steps of:
    forming in a surface of a substrate of semiconductor material of a first conductivity type adjacent surface regions that define a channel therebetween said channel being formed by masking an area of said surface of said substrate with a material impervious to diffusion therethrough of an impurity of the other conductivity type, diffusing said selected impurity into surface regions of said substrate not protected by said material, and removing said material to provide spaced p–n junctions with said channel therebetween, said channel having a width of about 10 microns.
    growing upon said substrate surface a first layer of a first semiconductor material of said first conductivity type,
    growing upon said first layer a second layer of a second semiconductor material of either said first conductivity type or of the other conductivity type to provide a second p–n junction, when said second layer is of said other conductivity type
    growing upon said second layer a third layer of said first semiconductor material, said third layer being of a conductivity type other of said first layer, to provide said second p–n junction when said second layer is of the first conductivity type, and
    providing electrodes for said laser such that when said p–n junction is forward biased the flow of pump current in said substrate is through said channel with the result that the flow of pump current is confined to a small region of said first layer and minority carriers are injected across said second p–n junction into only a small region of said second layer.
4. A method of making a diode laser comprising the steps of:
    forming a pump current confining channel in a layer of semiconductor material, said channel having a width of about 10 microns and subsequently providing a p–n junction between layers of semiconductor material such that pump current flowing through said channel results in the injection of minority carriers across said p–n junction with the resulting production of coherent light.
5. A method of making a diode laser having a p–n junction for the injection of minority carriers comprising the steps of:
    forming in a surface of a substrate of semiconductor material of a first conductivity type adjacent surface regions of material that define a channel therebetween,
       growing upon said substrate surface having said adjacent surface regions a first layer of semiconductor material of said first conductivity type,
       growing upon said first layer of semiconductor material a second layer of semiconductor material of the other conductivity type to thereby provide said p–n junction between said first and second layers, said second layer having a thickness of about 0.3 microns, and
    providing means for forward biasing said p–n junction such that pumping current flows through said channel to provide the injection of minority carriers across said p–n junction to thereby provide coherent light.
6. The method as defined in claim 5 wherein said channel is about 10 microns wide.
7. The method as defined in claim 5 wherein said first layer is about 0.2 microns thick.
8. The method as defined in claim 5 wherein said first layer is provided with a low doped carrier concentration of about $10^{17}/cm^3$.

* * * * *